United States Patent
Sekiguchi et al.

(10) Patent No.: US 8,319,565 B2
(45) Date of Patent: Nov. 27, 2012

(54) RESONATOR TUNNEL DEVICE

(75) Inventors: Ryota Sekiguchi, Kawasaki (JP); Yasushi Koyama, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 272 days.

(21) Appl. No.: 12/731,017

(22) Filed: Mar. 24, 2010

(65) Prior Publication Data

US 2010/0244994 A1    Sep. 30, 2010

(30) Foreign Application Priority Data

Mar. 27, 2009 (JP) ................................. 2009-079401

(51) Int. Cl.
*H03B 5/18* (2006.01)
(52) U.S. Cl. ................... 331/96; 331/107 R; 331/107 T
(58) Field of Classification Search ............ 331/96, 331/107 R, 107 T
See application file for complete search history.

(56) References Cited

U.S. PATENT DOCUMENTS

| | | | |
|---|---|---|---|
| 3,333,118 A * | 7/1967 | Cote, Jr | 706/33 |
| 5,981,969 A | 11/1999 | Yuan | |
| 8,125,281 B2 | 2/2012 | Sekiguchi | |
| 2006/0055476 A1 | 3/2006 | Kazakov | |

FOREIGN PATENT DOCUMENTS

| | | |
|---|---|---|
| JP | 06-204504 A | 7/1994 |
| JP | 2006-101495 A | 4/2006 |

* cited by examiner

*Primary Examiner* — Arnold Kinkead
(74) *Attorney, Agent, or Firm* — Canon U.S.A., Inc. IP Division

(57) ABSTRACT

To provide a resonator that includes a resonant tunneling diode. A resistor layer provided in series with the resonant tunneling diode, a dielectric provided in contact with the resonant tunneling diode, and first and second conductors that are placed so that the resonant tunneling diode and the dielectric are sandwiched therebetween are provided. Further, a resonator area where the dielectric is sandwiched between the first and second conductors, and a resistor area where the resonant tunneling diode and the resistor layer are sandwiched between the first and second conductors are provided in parallel with each other.

16 Claims, 7 Drawing Sheets

RESONATOR TUNNEL DEVICE

BACKGROUND OF THE INVENTION

1. Field of the Invention

The present invention relates to a resonator including a resonant tunneling diode (RTD) configured to generate an electromagnetic wave.

2. Description of the Related Art

It has been widely recognized that electronegative resistance elements include a resonator and can be applied for an electromagnetic wave generator. Hitherto, it has been recognized that the electronegative resistance element generates an electromagnetic wave (also referred to as a terahertz wave in this specification) including at least part of frequencies falling within a frequency band of from a millimeter wave band to a terahertz wave band inclusive (from 30 GHz to 30 THz inclusive).

As an example of the electronegative resistance elements, a monolithic resonator including a semiconductor substrate including the RTD, a microstrip conductor, and a grounding conductor, where the semiconductor substrate is sandwiched between the microstrip conductor and the grounding conductor, has been disclosed in Japanese Patent Laid-Open No. 2006-101495. A semi-insulating semiconductor substrate is used as a dielectric serving as an area defined to cause an electromagnetic wave generated through the resonant tunneling diode to resonate.

FIG. 7 is a sectional view illustrating the resonator disclosed in Japanese Patent Laid-Open No. 2006-101495. In the above-described resonator, a resonant tunneling diode hetero structure 10 is stacked on a semi-insulating semiconductor substrate 20. An insulation slab 20 (dielectric) is provided between a microstrip 70 and a grounded metal 30 to cause an electromagnetic wave generated through the resonant tunneling diode to resonate. At that time, the microstrip 70 and a bias pad 60 are connected to the resonant tunneling diode hetero structure 10 through the use of contact layers 80, 90 so that an electrical contact with the resonant tunneling diode hetero structure 10 is achieved. Further, a capacitance is generated through the bias pad 60 and the grounded metal 30 (capacitive coupling). Consequently, an electromagnetic wave of the above-described frequency band can be caused to resonate through a resonator including the microstrip 70, the grounded metal 30, and the insulation slab 20 via the resonant tunneling diode. The above-described configuration allows for reducing a delay time (RC time constant) measured from when a voltage is applied to the resonant tunneling diode to when a current is output from the resonant tunneling diode.

SUMMARY OF THE INVENTION

As described above, Japanese Patent Laid-Open No. 2006-101495 has disclosed that a substrate is used as the resonator. At that time, a material that can be used as the substrate is limited by an RTD stacked on the substrate. Further, the thickness of the substrate should be relatively small in consideration of the frequency of an electromagnetic wave for oscillation. Therefore, the thickness of the substrate should be determined to make the substrate fragile.

From the viewpoint of manufacturing, it has been difficult to select the thickness and/or the material of a dielectric included in the resonator through the technology disclosed in Japanese Patent Laid-Open No. 2006-101495. Therefore, there has been a limit to achieve a resonator configured to attain impedance matching with the resonant tunneling diode.

Further, a delay time (RC time constant) occurring in the resonant tunneling diode should be reduced as much as possible.

A resonator according to an embodiment of the present invention includes a resonant tunneling diode, a resistor layer provided in series with the resonant tunneling diode, a dielectric provided in contact with the resonant tunneling diode, and first and second conductors that are provided so that the resonant tunneling diode and the dielectric are sandwiched between the first and second conductors, wherein a resonator area where the dielectric is sandwiched between the first and second conductors and a resistor area where the resonant tunneling diode and the resistor layer are sandwiched between the first and second conductors are provided in parallel with each other.

A resonator according to another embodiment of the present invention at least includes two conductors that are opposed to each other, and a resonant tunneling diode having a resonant tunneling structure layer provided in contact with each of the two conductors via an electrical contact layer and a dielectric that are provided between the two conductors. The resonant tunneling diode includes a resistor layer stacked on the resonant tunneling structure layer, the in-plane cross-sectional area of the resistor layer is larger than the in-plane cross-sectional area of the resonant tunneling structure layer, the in-plane cross-sectional area of a part of the resistor layer, the part being sandwiched between the two conductors, almost matches with the in-plane cross-sectional area of the resonant tunneling structure layer. According to an embodiment of the present invention, a resistor layer is provided between an RTD and a conductor so that a resonator can have an appropriate thickness. Further, a dielectric can be selected as a resonator according to an embodiment of the present invention. For example, a dielectric having a permittivity lower than that of a known semi-insulating substrate can be selected as the dielectric. Further, it becomes possible to select a dielectric having a relatively small dielectric loss within a frequency range of from a millimeter wave band to a terahertz wave band inclusive (from 30 GHz to 30 THz inclusive) as the above-described dielectric. At the same time, the resistor layer can be made to have a special cross-sectional shape to minimize a delay time. That is to say, the stray capacitance (a parasitic capacitance occurring between the resistor layer and the conductor such as a parasitic capacitance 26 shown in FIG. 1B) can be minimized and the series resistance of the resonant tunneling diode can be reduced through the resistance layer. Further, the delay time (RC time constant) can also be reduced through the above-described configuration. Consequently, the power (the product of a voltage and a current) is increased and the power of a terahertz wave for oscillation is increased.

A resonator having the above-described effects can be used for an oscillator that can oscillate an electromagnetic wave including at least part of frequencies falling within a frequency band of from a millimeter wave band to a terahertz wave band (from 30 GHz to 30 THz inclusive).

Further features of the present invention will become apparent from the following description of exemplary embodiments with reference to the attached drawings.

DESCRIPTION OF THE EMBODIMENTS

Figure 1A:
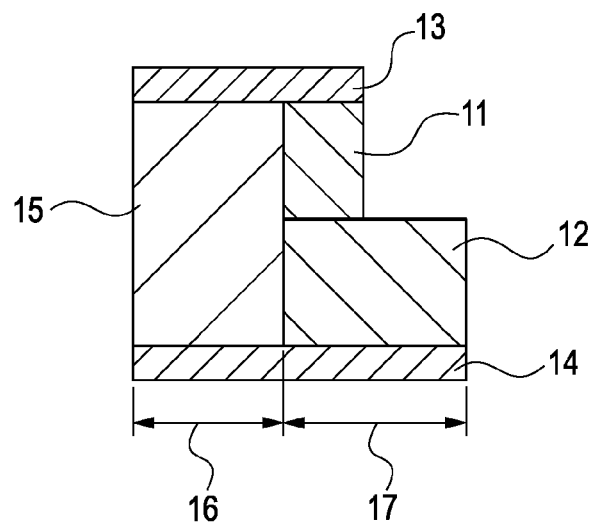
FIG. 1A is a schematic diagram showing the configuration of a resonator according to an embodiment of the present invention.
Figure 1B:
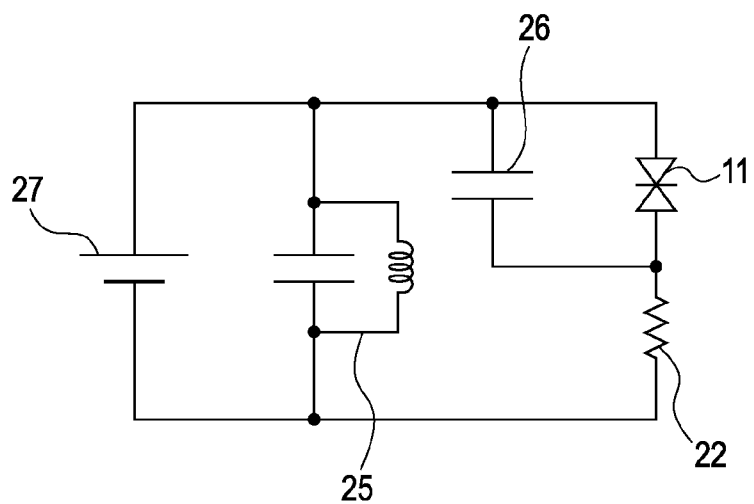
FIG. 1B is a schematic diagram showing a circuit equivalent to the resonator according to the embodiment.

A resonator according to an embodiment of the present invention will be described with reference to FIGS. 1A and 1B. Here, FIG. 1A is a schematic diagram illustrating the configuration of the resonator according to the above-described embodiment. FIG. 1B is a schematic diagram showing a circuit equivalent to the resonator according to the above-described embodiment.

First, a resonant tunneling diode (RTD) 11 is configured to generate an electromagnetic wave. The RTD 11 includes a resonant tunneling structure layer having a plurality of tunneling barrier layers, where a quantum well layer is provided between the tunneling barrier layers. Incidentally, it is preferable that the frequency of the electromagnetic wave fall within the frequency range of from 30 GHz to 30 THz inclusive.

Next, a resistor layer 12 is provided in series with the RTD 11 so that the resistor layer 12 is placed along a direction approximately perpendicular to the in-plane direction of the RTD 11. At that time, the resistor layer 12 functions as a resistor 22 placed in series with the RTD 11 in the equivalent circuit. The resistor 22 has a dependence on the material and/or the size (e.g., the cross-sectional area in the in-plane direction and the film thickness) of the resistor layer 12.

Further, a first conductor 13 doubles as an electrode applying a current to the RTD 11 and is in electrical contact with the RTD 11. A second conductor 14 doubles as another electrode applying a current to the RTD 11 and is in electrical contact with the resistor layer 12. The RTD 11 and the resistor layer 12 are sandwiched between the first and second resistors 13 and 14 in a direction approximately perpendicular to the in-plane direction of the RTD 11.

Here, it is preferable that a first electrical contact layer (a first contact layer 102 shown in FIG. 1C) be provided so as to be in contact with the resonant tunneling structure layer and the first conductor 13. Further, it is preferable that a second electrical contact layer (a second contact layer 103 shown in FIG. 1C) be provided so as to be in contact with the resonant tunneling structure layer and the resistor layer 12. Consequently, it becomes possible to control a current applied to the resonant tunneling structure layer.

A dielectric 15 can cause the generated electromagnetic wave to resonate and is provided so as to be in contact with a face approximately perpendicular to the in-plane direction of the RTD 11. At that time, the dielectric 15 provided between the first conductor (a first electrode) 13 and the second conductor (a second electrode) 14 functions as a distributed constant resonator 25 in the equivalent circuit.

A resonator area 16 including the dielectric 15 sandwiched between the first and second conductors 13 and 14 and a resistor area 17 including the RTD 11 and the resistor layer 12 that are sandwiched between the first and second conductors 13 and 14 are provided in parallel with each other. Consequently, it becomes possible to reduce the capacitance of the resistor layer 12 and the first conductor 13 (a parasitic capacitance 26). Here, a delay time discussed in an embodiment of the present invention denotes an RC time constant acquired based on the product of the resistance of the resistor layer 12 and the above-described capacitance (the parasitic capacitance 26).

Further, it is preferable that the in-plane cross-sectional area of the resistor layer 12 sandwiched between the first and second conductors 13 and 14 be larger than that of the RTD 11 so as to minimize the delay time (RC constant). Further, it is preferable that the width of the in-plane cross-sectional area of the resistor layer 12 be more than twice as large as the skin depth of the electromagnetic wave.

A power source (voltage applying unit) 27 provided in the equivalent circuit is provided in parallel with the RTD 11 to apply a current to the RTD 11 via the first and second conductors 13 and 14.

Further, it is preferable that the dielectric 15 be sandwiched between the first and second conductors 13 and 14, and be in contact with a face approximately perpendicular to the in-plane direction of the RTD 11.

Further, it is preferable that an electrical contact face defined between the first conductor and the RTD 11 be configured as below. First, it is preferable that the in-plane cross-sectional area of the first conductor be larger than that of the resonant tunneling structure layer. Further, it is preferable that the in-plane cross-sectional area of the first conductor be smaller than that of the resistor layer 12.

First Embodiment

Figure 1C:
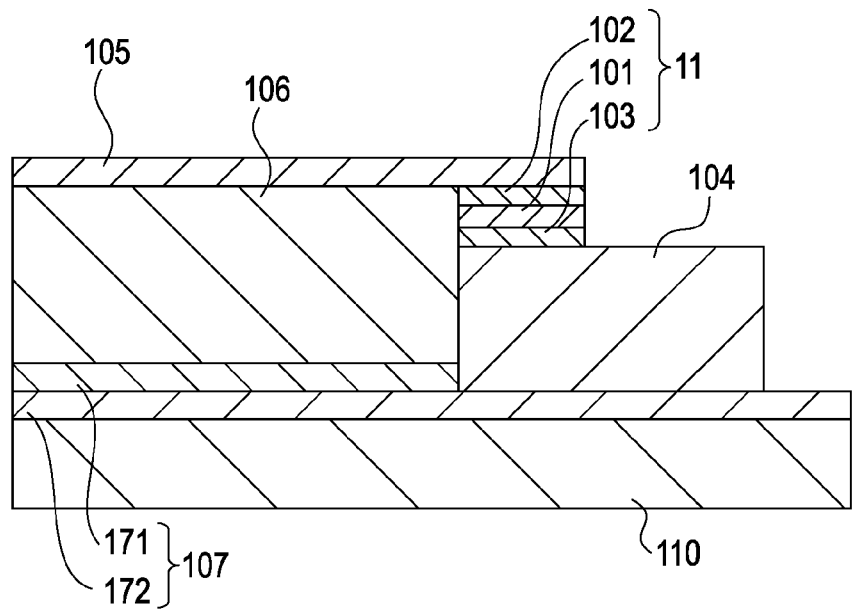
FIG. 1C is a schematic diagram showing the configuration of a resonator according to a first embodiment of the present invention.

A resonator according to a first embodiment of the present invention will be described with reference to FIG. 1C. FIG. 1C shows a sectional view of the resonator of the first embodiment.

An RTD according to the first embodiment includes a resonant tunneling structure layer 101, the electrical contact layers 102 and 103 (first and second electrical contact layers 102 and 103) that are provided to apply a current to the resonant tunneling structure layer 101, and a resistor layer 104. The resonator of the first embodiment includes two conductors 105 and 107 that are opposed to each other (first and second conductors 105 and 107), and a dielectric 106 provided between the two conductors 105 and 107. The resonant tunneling structure layer 101 is connected to a grounded metal 171 via a metal contact layer 172, and the conductor 107 (the grounded metal 171 and the grounded metal layer 172) doubles as a common electrode provided for a direct current (DC) and an alternating current (AC). Therefore, the conductor 105 (first conductor) serves as a bias pad and a microstrip. Accordingly, a resonator can be provided on a semiconductor substrate 110 having a resonant tunneling diode. The above-described configuration allows for causing an electromagnetic wave which falls within a frequency band defined in a frequency range of from a millimeter wave band to a terahertz wave band inclusive (from 30 GHz to 30 THz inclusive) to resonate through a resonator (including the two conductors 105 and 107, and the dielectric 106) via the resonant tunneling structure layer 101.

Accordingly, it becomes possible to adjust the thickness of the resonator based on the thickness of the resistor layer 104. The characteristic impedance of the microstrip 105 (first conductor) has a dependence on the thickness and the material of the dielectric 106. In an exemplary manner, the dielectric 106 is designed so that the thickness thereof is adequately smaller than the wavelength of the electromagnetic wave. It has been recognized that the characteristic impedance is increased with an increase in the thickness and is decreased with a decrease in the thickness. Further, it has been recognized that the characteristic impedance is increased with a decrease in the permittivity of the material and is decreased with an increase in the permittivity of the material (see Chapter 3 of "Transmission Line Design Handbook", ARTECH HOUSE INC (1991) by Brian C. Wadell). Thus, the resonator of the above-described embodiment of the present invention can select the material and/or the thickness of the dielectric so as to attain impedance matching with the RTD.

Figure 4A:
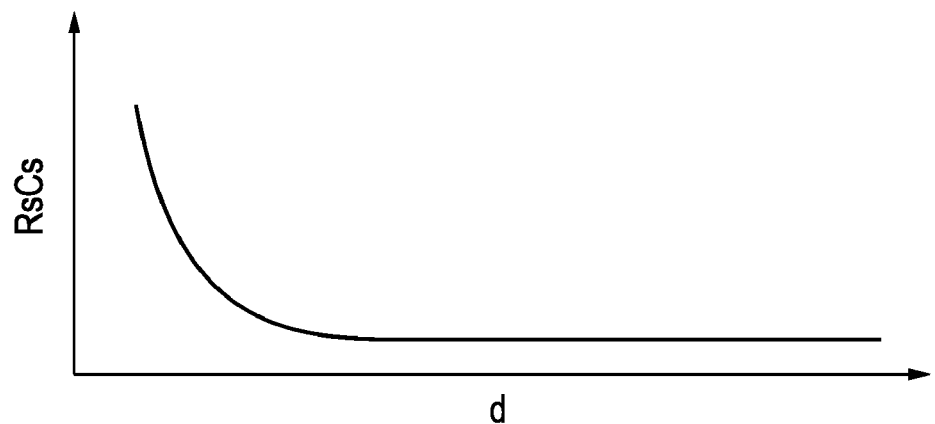
FIG. 4A is a schematic diagram showing the relationship between the cross-sectional area of the resistor layer of a resonator according to an embodiment of the present invention and an RC time constant.
Figure 4B:
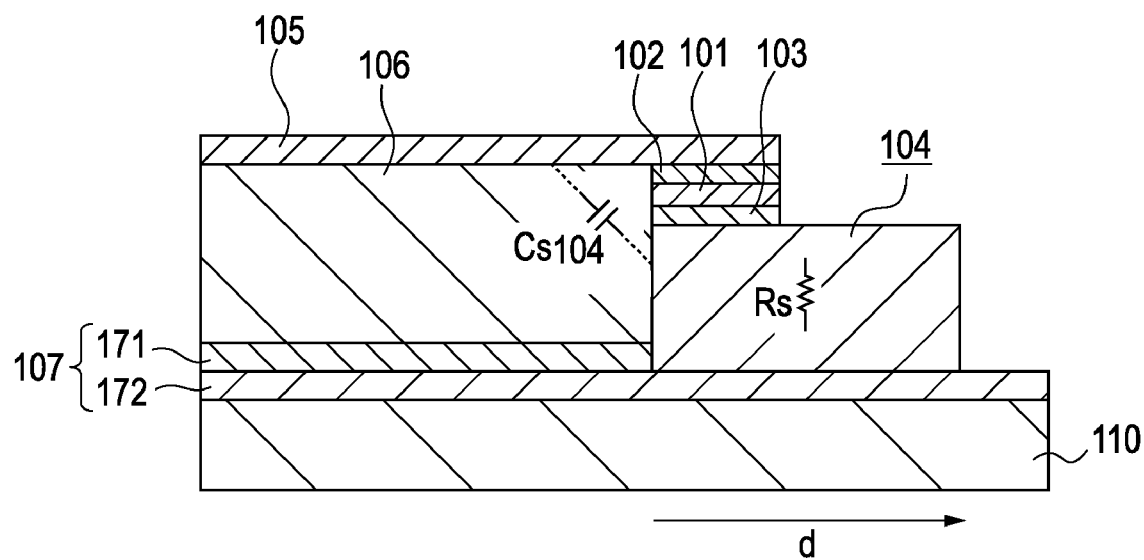
FIG. 4B is another schematic diagram showing the relationship between the cross-sectional area of the resistor layer of the resonator according to the embodiment and the RC time constant.

Further, in the above-described embodiment, the cross-sectional shape of a part of the resistor layer 104, the part being sandwiched between the two conductors 105 and 107 serving as a resonator, almost agrees with the in-plane-cross-sectional shape of the resonant tunneling structure layer. Therefore, the resonator does not have a part sandwiched between the conductor 105 and the resistor layer 104 so that the occurrence of a parasitic stray capacitance $Cs_{104}$ can be minimized even though a series resistance Rs occurs in the resistor layer 104 as shown in FIG. 4B. The product $RSCs_{104}$ of the series resistance Rs and a series resistance described below should be minimized.

Japanese Patent Laid-Open No. 06-204504 has disclosed that the series resistance Rs of the RTD 11 can be adjusted based on the cross-sectional area of the resistor layer 104.

Therefore, the cross-sectional area of a part of the resistor layer 104 should be increased, where the part is not sandwiched between the two conductors 105 and 107. That is to say, the product $RsCs_{104}$ is decreased with an increase in the cross-sectional area of the resistor layer 104 as shown in FIG. 4A. Further, in consideration of a high frequency having the property of flowing near the surface, it is preferable that the width d of the resistor layer 104 be more than twice as large as the skin depth δ to minimize the series resistance Rs. The above-described theory usually holds true for the case where the thickness in the stacking direction of the resistor layer 104 is larger than the skin depth δ. As a result, the cross-sectional shape of only a part of the resistor layer 104, the part being sandwiched between the two conductors 105 and 107, agrees with the in-plane cross-sectional shape of the resonant tunneling structure layer.

In the resonator according to the above-described embodiment, the resonant tunneling structure layer 101 is stacked on the semiconductor substrate 110. Therefore, it is assumed that the resistor layer 104 also includes a semiconductor material. The material of the above-described resistor layer 104, resonant tunneling structure layer 101, and electrical contact layers 102 and 103 that are used to apply a current to the resonant tunnel structure layer 101 may include GaAs/AlGaAs provided on a GaAs substrate and/or InGaAs/InAlAs and InGaAs/AlAs that are provided on an InP substrate. Further, without being limited to the above-described embodiment, a semiconductor multilayer film structure including InAs/AlAsSb and/or InAs/AlSb provided on an InAs substrate, InGaAs/AlGaAsSb provided on an InP substrate, Si/SiGe provided on a Si substrate, and so forth may be provided. As a majority carrier of the RTD 11, an electron and/or a positive hole may be selected by performing carrier doping for the electrical contact layers 102 and 103. The same selection is made to determine the conductivity type of the resistor layer 104.

Second Embodiment

Microstrip Antenna

Figure 2A:
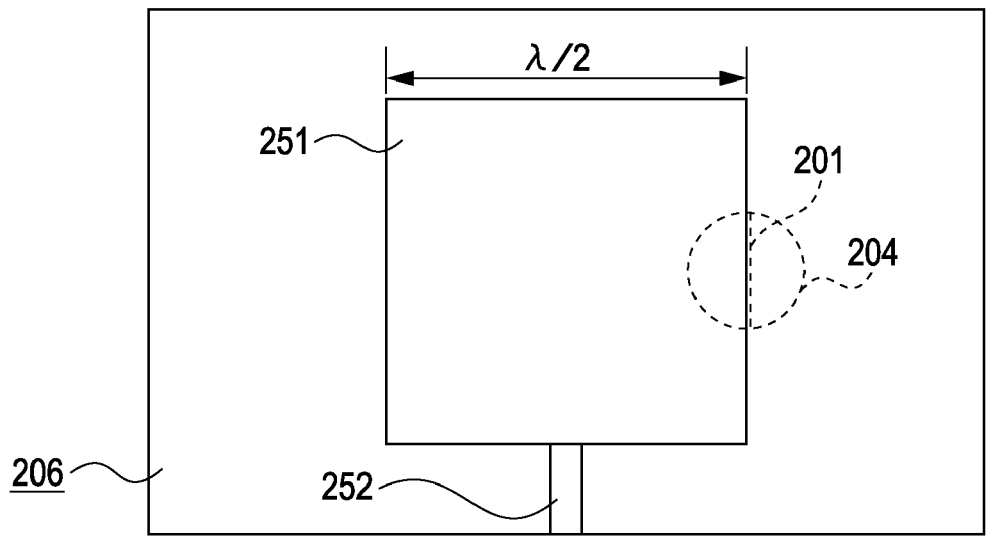
FIG. 2A is a schematic diagram showing the configuration of a resonator according to a second embodiment of the present invention.
Figure 2B:
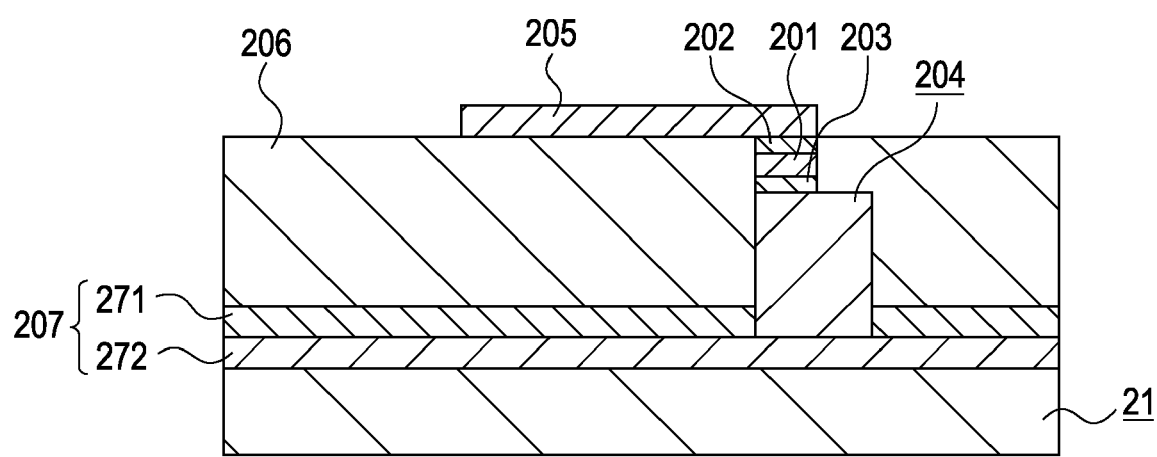
FIG. 2B is another schematic diagram showing the configuration of the resonator according to the second embodiment.

A resonator according to a second embodiment of the present invention will be described with reference to FIGS. 2A and 2B. FIG. 2A is the top plan view of the resonator of the above-described embodiment and FIG. 2B is the sectional view of the resonator of the above-described embodiment. The resonator of the above-described embodiment includes a patch antenna which is widely known as a microstrip antenna. The patch antenna is a distributed constant resonator and the resonance frequency thereof is determined based on the in-plane length of a patch antenna 251. Usually, a λ/2 patch antenna is used. An electromagnetic wave emitted from a resonant tunneling diode is caused to resonate with the patch antenna and oscillates. Then, the electromagnetic wave can be taken outside through the use of the load on the patch antenna 251. Here, the specification of the load on the patch antenna 251 is determined based on a desired output to be taken out. According to an embodiment of the present invention, the specification can be adjusted based on the thickness of a dielectric 206, that is, the thickness of the resistor layer 204. The input impedance corresponding to the resonance frequency of the patch antenna 251 is increased with an increase in the thickness of the dielectric 206, and is decreased with a decrease in the thickness of the dielectric 206. Further, the input impedance is increased with a decrease in the permittivity of the material of the dielectric 206 and is decreased with an increase in the permittivity of the material of the dielectric 206. Thus, the impedance of a resonator according to an embodiment of the present invention can be adjusted. A bias line 252 is used to apply a current to a resonant tunneling structure layer 201. The bias line 252 is connected to the power supply or the like via a bias tee, for example.

In the above-described embodiment, the resistor layer 204 seen from above is circular in cross section so that the resistor layer 204 agrees with the resonant tunneling structure layer 201 which is arc-shaped in cross section. For example, the resistor layer 204 may be square and/or convex in cross section when the resonant tunneling structure layer 201 is square in cross section.

A hemispherical silicon lens may be placed on the top face of the resistor layer 204 as a coupling member used to couple the resistor layer 204 and the above-described patch antenna with an increased efficiency. Further, a horn antenna manufactured through micro-electro-mechanical-systems (MEMS) process may be placed on the top face of the resistor layer 204. The resonator of the above-described embodiment is appropriately used in a frequency band defined within a frequency range of from a millimeter wave band to a terahertz wave band inclusive (from 30 GHz to 30 THz inclusive).

Third Embodiment

Microstrip Filter

Figure 3A:
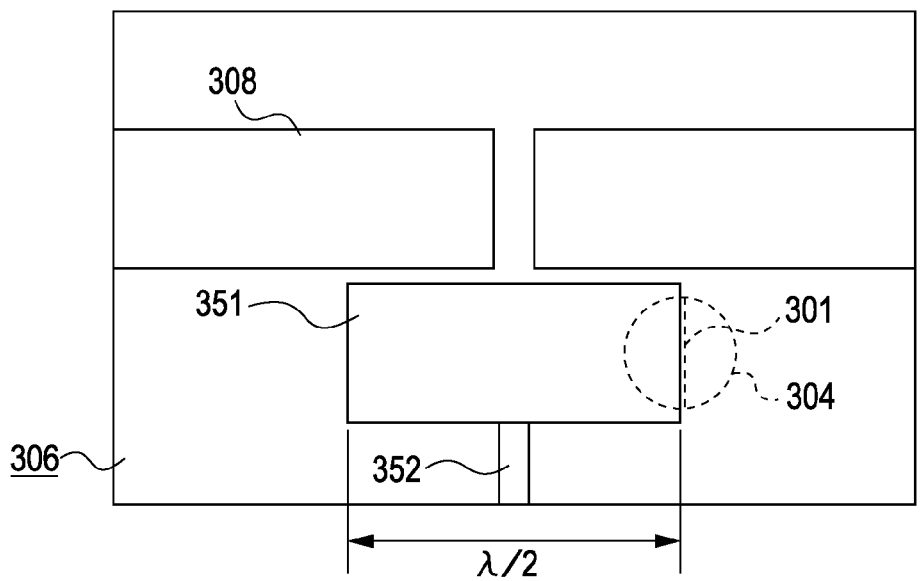
FIG. 3A is a schematic diagram showing the configuration of a resonator according to a second embodiment of the present invention.
Figure 3B:
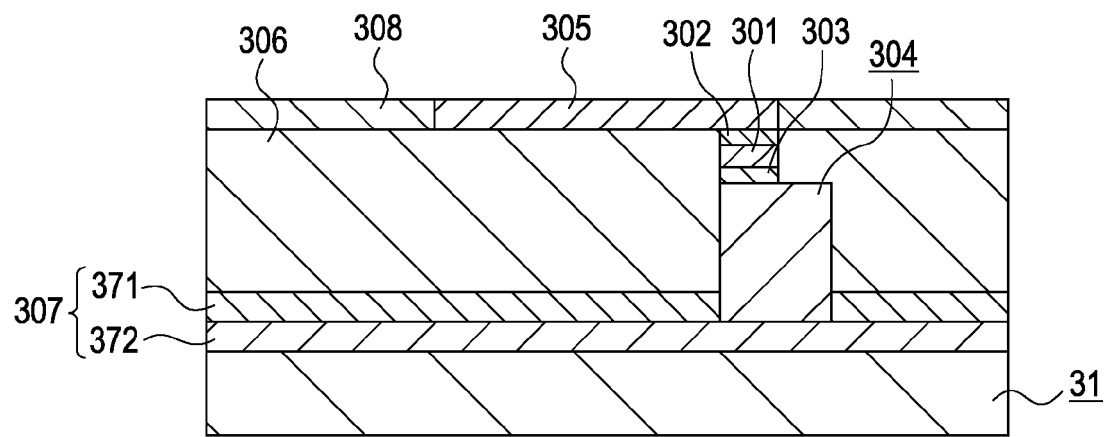
FIG. 3B is another schematic diagram showing the configuration of the resonator according to the second embodiment.

A resonator according to a third embodiment of the present invention will be described with reference to FIGS. 3A and 3B. FIG. 3A is the top plan view of the resonator of the above-described embodiment and FIG. 3B is the sectional view of the resonator of the above-described embodiment. The resonator of the above-described embodiment includes a coupled-line filter widely known as a microstrip filter. The coupled-line filter is a distributed constant resonator and the resonance frequency thereof (specified frequency) is determined based on the in-plane length of a microstrip-line resonator 351. Usually, a λ/2 microstrip line is used. Further, two microstrip lines 308 are provided to have a magnetic field coupling with the λ/2 microstrip line. An electromagnetic wave emitted from a resonant tunneling diode is injection-synchronized with an electromagnetic wave transmitted to one of the microstrip lines 308 and oscillates. In this manner, an electromagnetic wave with an amplitude larger than that of the transmitted electromagnetic wave can be taken and transmitted to the other microstrip line 308. The above-described phenomenon is significant in a frequency band (specified frequency band) near the resonance frequency determined by the microstrip line resonator 351 so that the filter passes through the frequency band near the resonance frequency. Usually, the value of the characteristic impedance of the microstrip line 308 is 50Ω. Therefore, the value of the characteristic impedance of the microstrip line resonator 351 should be 50Ω or around. However, in an embodiment of the present invention, the characteristic impedance of the microstrip line resonator 351 can be adjusted based on the thickness of the dielectric 306, that is, the thickness of the resistor layer 304. The characteristic impedance of the microstrip line is increased with an increase in the thickness of the dielectric 306 and is decreased with a decrease in the thickness of the dielectric 306. Further, an adjustment can be made so that the characteristic impedance of the microstrip line is increased with a decrease in the permittivity of the material and is decreased with an increase in the permittivity of the material. Thus, the impedance of a resonator according to an embodiment of the present invention can be adjusted. A bias line 352 is used to apply a current to a resonant tunneling structure layer 301. The bias line 352 is connected to the power supply or the like via a bias tee, for example.

The resonator of the above-described embodiment is appropriately used in a frequency band defined within a frequency range of from a millimeter wave band to a terahertz wave band inclusive (from 30 GHz to 30 THz inclusive).

More detailed configurations of the above-described resonator will be described in the following embodiments.

Embodiments

Figure 5A:
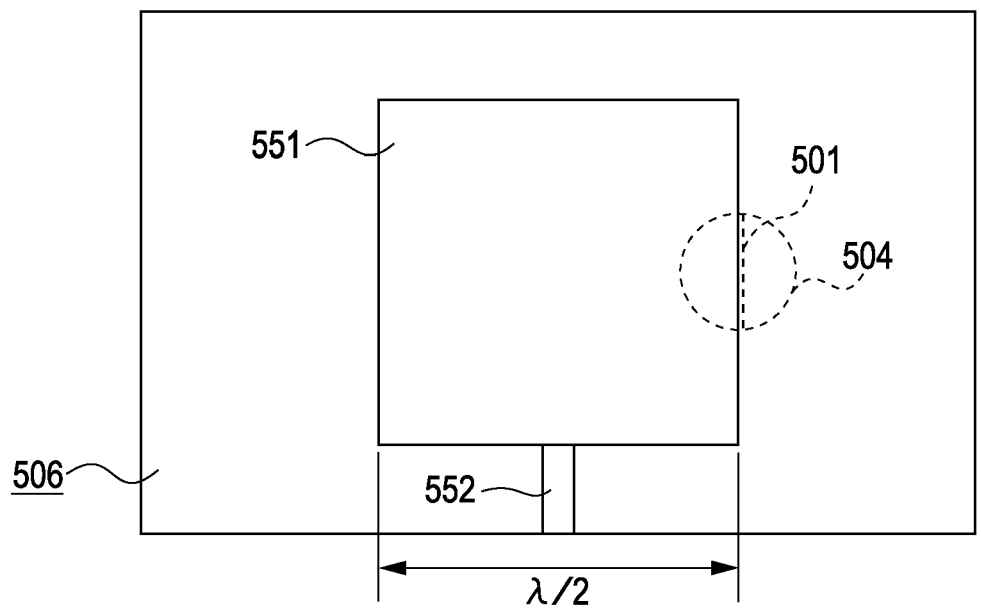
FIG. 5A is another schematic diagram showing the configuration of the resonator according to the first embodiment.
Figure 5B:
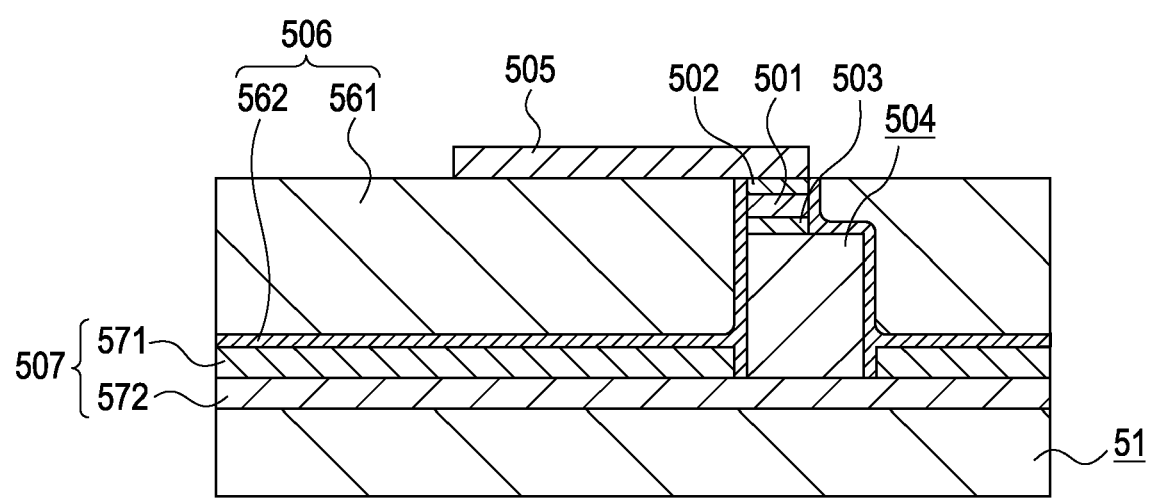
FIG. 5B is another schematic diagram showing the configuration of the resonator according to the first embodiment.

Each of FIGS. 5 and 6 shows a resonator according to an embodiment of the present invention. FIG. 5A is a top plan view of the configuration of the resonator and FIG. 5B is a sectional view of the configuration of the resonator. The resonator of the above-described embodiment includes a patch antenna widely known as a microstrip antenna. A resonant tunneling diode of the above-described embodiment includes a resonant tunneling structure layer 501 including InGaAs/InAlAs and InGaAs/AlAs that are provided on an InP substrate, electrical contact layers 502 and 503 including n-InGaAs, and a resistor layer 504 including n-InP. The resonant tunneling structure layer 501 includes, for example, a resonant tunneling diode having three barrier layers. More specifically, the resonant tunneling structure layer 501 has a semiconductor multilayer film structure including AlAs having a thickness of 1.3 nm/InGaAs having a thickness of 7.6 nm/InAlAs having a thickness of 2.6 nm/InGaAs having a thickness of 5.6 nm/AlAs having a thickness of 1.3 nm that are stacked in that order from the electrical contact layer 502-side to the electrical contact layer 503-side. Of the above-described layers, the layer including InGaAs is a well layer, and the layer InAlAs attaining lattice matching and the layer AlAs attaining no matching are barrier layers. The above-described layers are not subjected to carrier doping deliberately, that is to say, the above-described layers are undoped. In the above-described embodiment, the resistor layer 504 has an electron density of about $5 \times 10^{18}$ cm$^{-3}$. The resonator of the above-described embodiment includes a benzocyclobutene (BCB) 561 provided between two conductors 505 and 507 that are opposed to each other, where the BCB is known as a low-loss dielectric having a relatively small dielectric loss within a frequency range of from a millimeter wave band to a terahertz wave band inclusive (from 30 GHz to 30 THz inclusive). The conductor 507 (a grounded metal 571 and a metal contact layer 572) doubles as a common electrode provided for a DC and an AC. However, in the above-described embodiment, the grounded metal 571 includes, for example, Ti/Au and the metal contact layer 572 includes n-Inp provided on an InP substrate 51. The conductor 507 also has an electron density of about $5 \times 10^{18}$ cm$^{-3}$. An n-type conductive substrate may be selected as the InP substrate 51. In that case, the conductive InP substrate 51 may double as the resistor layer 504 and the metal contact layer 572. In the above-described embodiment, a square-shaped patch 551 with 200 μm sides is selected as the patch antenna. Further, in the above-described embodiment, the patch antenna 551 has a load of 50Ω to match with a relatively low-impedance resonant tunneling diode. Therefore, the BCB 561 should have a film thickness of about 3 μm. Consequently, the film thickness of the resistor layer 504 is determined to be 3 μm. When the cross-sectional area of the resonant tunneling structure layer 501 of the above-described patch antenna 551 is 3 μm$^2$, the value of an oscillation frequency is estimated to be 0.4 THz or around.

The cross-sectional area of the resistor layer 504 of the above-described embodiment is more than 3 μm$^2$. It is preferable that the cross-sectional shape of the resistor layer 504 be determined in consideration of the skin depth. When the oscillation frequency of 0.4 THz is used, the skin depth δ of the resistor layer 504 is estimated to be 2 μm. Therefore, the cross-sectional shape of the resistor layer 604 is determined to be, for example, a circle measuring 4 μm in diameter.

Thus, the resonator of the above-described embodiment can be used as a resonator that can take an electromagnetic wave with a frequency which falls within a frequency band defined in a frequency range of from a millimeter wave band to a terahertz wave band inclusive (from 30 GHz to 30 THz inclusive).

The resonator of the above-described embodiment can be manufactured according to the following manufacturing methods. First, the next layer is epitaxially grown on the InP substrate 51 according to the molecular beam epitaxy (MBE) method and/or the metalorganic vapor phase epitaxy (MOVPE) method. That is to say, the n-InP 572, the n-InP 504, the n-InGaAs 503, the resonant tunneling structure layer 501 including the undoped InGaAs/InAlAs, and the n-In-GaAs 502 are epitaxially grown in that order. When the n-type conductive substrate is selected as the InP substrate 51, the layer growing should be started from the n-InGaAs 503. Next, the resonant tunneling structure layer 501, the electrical contact layers 502 and 503, and the resistor layer 504 are etched to form a circular mesa. Further, the resonant tunneling structure layer 501 and the electrical contact layers 502 and 503 are etched to form an arc-shaped mesa having a cross-sectional area of 3 μm². The above-described etching is achieved according to a dry etching method performed through electron beam (EB) lithography and inductively coupled plasma (ICP). Further, the above-described etching may be achieved through photolithography. Next, the grounded metal 571 is formed on the face of the exposed n-InP 572 according to the lift-off method. A passivation film 562 provided to protect the sidewall of the resonant tunneling structure layer 501 is formed by using silicon nitride according to, for example, the plasma chemical-vapor deposition (CVD) method. On a part by which the resonator is provided, the part being secured by determining the film thickness of the resistor layer 504 to be 3 μm, the BCB 561 is formed to have a film thickness of about 3 μm according to the spin coating method and the dry etching method so that the n-InGaAs 502 is exposed. Finally, the Ti/Pd/Au 505 is formed according to the lift-off method so that the resonator of the above-described embodiment is completed.

Figure 6A:
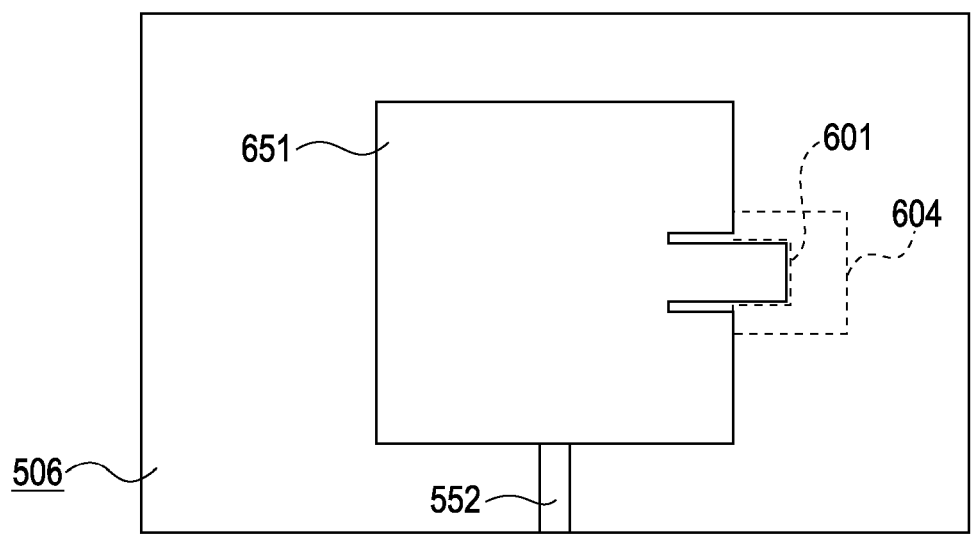
FIG. 6A is a schematic diagram showing an exemplary modification of the resonator according to the first embodiment.
Figure 6B:
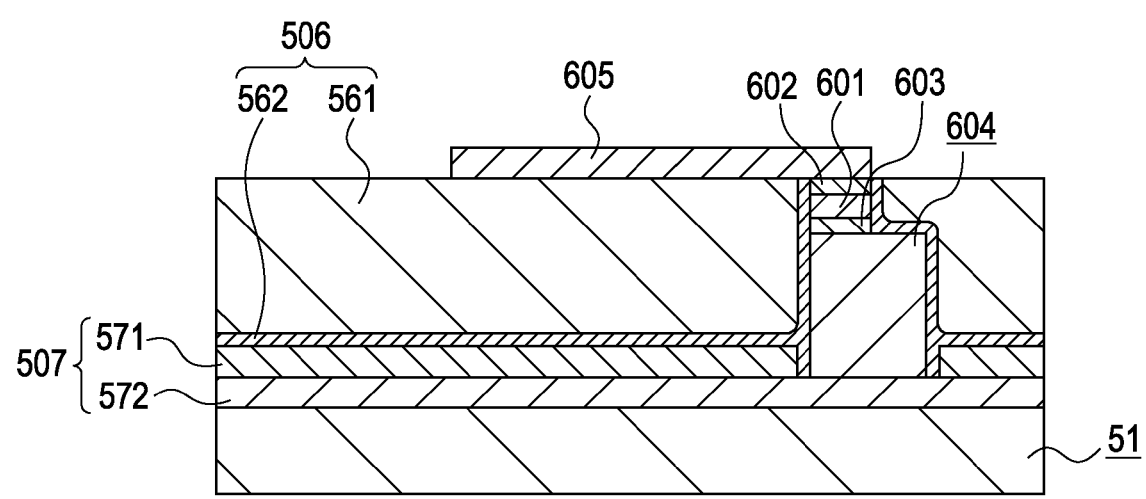
FIG. 6B is another schematic diagram showing the exemplary modification of the resonator according to the first embodiment.
Figure 7:
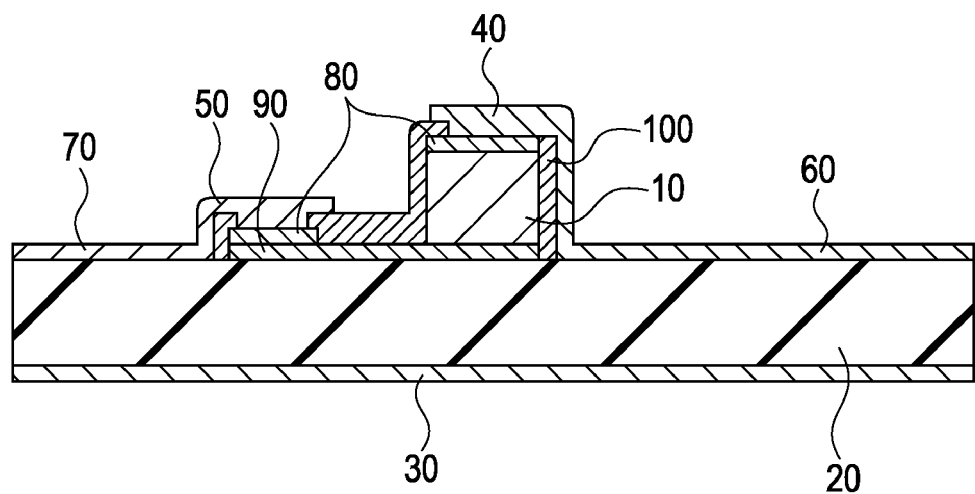
FIG. 7 is a schematic diagram showing the configuration of a resonator disclosed in Patent Document 1.

Further, a resonator including the same patch antenna may be configured as an exemplary modification of the first embodiment as shown in FIGS. 6A and 6B. In the first embodiment, the position of the resonant tunneling diode seen above corresponds to an end of the square-shaped patch 551, and the adjustment of an input impedance is limited. However, according to the above-described modification, a square-shaped patch 651 is provided with slits so that the resonant tunneling diode is provided inside the square-shaped patch 651 in real terms, which makes it possible to make a further adjustment to the input impedance. At that time, a resonant tunneling structure layer 601, electrical contact layers 602 and 603, and a resistor layer 604 may be provided to form a square-shaped mesa.

The above-described embodiment allows for attaining the above-described influences and/or effects clarified in the above-described embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-079401 filed on Mar. 27, 2009, which is hereby incorporated by reference herein in its entirety.

What is claimed is:

1. A resonator comprising:
a resonant tunneling diode;
a resistor layer provided in series with the resonant tunneling diode;
a dielectric provided in contact with the resonant tunneling diode; and
first and second conductors that are provided so that the resonant tunneling diode and the dielectric are sandwiched between the first and second conductors,
wherein a resonator area where the dielectric is sandwiched between the first and second conductors and a resistor area where the resonant tunneling diode and the resistor layer are sandwiched between the first and second conductors are provided in parallel with each other, and
wherein an in-plane cross-sectional area of the resistor layer is larger than an in-plane cross-sectional area of the resonant tunneling diode.

2. The resonator according to claim 1, wherein a width of an in-plane cross-sectional area of the resistor layer is more than twice as large as a skin depth of an electromagnetic wave.

3. The resonator according to claim 1, wherein a thickness of the resistor layer, the thickness being defined along a direction approximately perpendicular to an in-plane direction of the resistor layer, is larger than a skin depth of an electromagnetic wave.

4. A resonator comprising:
a resonant tunneling diode;
a resistor layer provided in series with the resonant tunneling diode;
a dielectric provided in contact with the resonant tunneling diode; and
first and second conductors that are provided so that the resonant tunneling diode and the dielectric are sandwiched between the first and second conductors,
wherein a resonator area where the dielectric is sandwiched between the first and second conductors and a resistor area where the resonant tunneling diode and the resistor layer are sandwiched between the first and second conductors are provided in parallel with each other, and
wherein the resonator is a microstrip antenna configured to emit an electromagnetic wave.

5. The resonator according to claim 4, wherein the resonator is a microstrip filter configured to pass through a specified frequency band of an electromagnetic wave.

6. The resonator according to claim 1, wherein, on an electrical contact face defined between the first conductor and the resonant tunneling diode, an in-plane cross-sectional area of the first conductor is larger than an in-plane cross-sectional area of the resonant tunneling structure layer and is smaller than an in-plane cross-sectional area of the resistor layer.

7. The resonator according to claim 4, wherein a frequency of an electromagnetic wave falls within a frequency range of from 30 gigahertz to 30 terahertz inclusive.

8. The resonator according to claim 4, wherein the resonant tunneling diode includes a resonant tunneling structure layer including a plurality of tunneling barrier layers and an electrical contact layer provided to apply a current to the resonant tunneling structure layer.

9. The resonator according to claim 4, further comprising a voltage applying unit that is provided in parallel with the resonant tunneling diode and that is configured to apply a current to the resonant tunneling diode via the first and second conductors.

10. A resonator comprising:
a resonant tunneling diode;
a resistor layer provided in series with the resonant tunneling diode;
a dielectric provided in contact with the resonant tunneling diode; and
first and second conductors that are provided so that the resonant tunneling diode and the dielectric are sandwiched between the first and second conductors,
wherein a resonator area where the dielectric is sandwiched between the first and second conductors and a resistor area where the resonant tunneling diode and the resistor layer are sandwiched between the first and second conductors are provided in parallel with each other, and wherein the resonant tunneling diode generates an electromagnetic wave.

11. The resonator according to claim 10, wherein the resistor layer is configured to have a delay time shorter than a cycle of the electromagnetic wave.

12. The resonator according to claim 11, wherein the delay time is acquired based on a product of a capacitance of the first conductor and the resistor layer, and a resistance of the resistor layer.

13. A resonator comprising:
a resonant tunneling diode;
a resistor layer provided in series with the resonant tunneling diode;
a dielectric provided in contact with the resonant tunneling diode; and
first and second conductors that are provided so that the resonant tunneling diode and the dielectric are sandwiched between the first and second conductors,
wherein a resonator area where the dielectric is sandwiched between the first and second conductors and a resistor area where the resonant tunneling diode and the resistor layer are sandwiched between the first and second conductors are provided in parallel with each other, and wherein the resistor layer in series with the resonant tunneling diode is provided in a direction approximately perpendicular to an in-plane direction of the resonant tunneling diode.

14. The resonator according to claim 13, wherein the first conductor doubles as an electrode is configured to apply a current to the resonant tunneling diode and is provided in electrical contact with the resonant tunneling diode.

15. The resonator according to claim 13, wherein the second conductor doubles as an electrode is configured to apply a current to the resonant tunneling diode and is provided in electrical contact with the resistor layer.

16. The resonator according to claim 13, wherein the dielectric is sandwiched between the first and second conductors, and is in contact with a face perpendicular to the in-plane direction of the resonant tunneling diode.

* * * * *